March 14, 1961 H. A. R. WEGENER 2,975,344

SEMICONDUCTOR FIELD EFFECT DEVICE

Filed May 28, 1959

INVENTOR
HORST A. R. WEGENER
BY
Eyre, Mann & Lucas
ATTORNEYS 2,975,344

SEMICONDUCTOR FIELD EFFECT DEVICE

Horst A. R. Wegener, Bloomfield, N.J., assignor to Tung-Sol Electric Inc., a corporation of Delaware Filed May 28, 1959, Ser. No. 816,528

8 Claims. (Cl. 317—235)

This invention relates to semiconductor devices and comprises a field effect transistor suitable for operation as an amplifier having a high ratio of voltage amplification.

Field effect transistors have generally been made by first producing a very thin layer of conductive material. Means are provided for the application of a transverse voltage which sweeps away the electrical carriers and pinches off the current flow. Prior field effect transistors have been made by mechanical removal of conductive material and the resulting device was fragile and easily overloaded. The present invention uses no mechanical cutting means for forming the transistor but instead produces a thin layer of conductivity material on a much larger and heavier piece of non-conductive material.

The thin layer of conductive material may be formed on a flat supporting piece; several flat pieces (independent of each other) may be formed on a single supporting non-conductor and the thin layers may be wrapped around a solid supporting cylinder or a tube.

One of the objects of this invention is to provide an improved field effect transistor which avoids one or more of the disadvantages and limitations of prior art arrangements.

Another object of the invention is to provide a field effect transistor which is formed without the use of mechanical means for the removal of material.

Another object of the invention is to provide a field effect transistor which is mechanically rugged.

Another object of the invention is to combine several field effect transistors on a single supporting member. The array of transistors may be used as amplifier stages, a push-pull circuit, or other combinations of transistor components.

Another object of the invention is to increase the power handled by field effect transistors by using a larger effective area for greater heat dissipation.

The invention comprises a block of semiconductor material which has first been treated to make it an insulator. Such a treatment may include the diffusion of another element into the block. One of the surfaces of the block is then subjected to a second diffusion treatment to produce a thin layer of either P or N-type material. Then a small transverse section of the block is again diffused to produce an opposite type material, N or P.

For a better understanding of the present invention, together with other and further objects thereof, reference is made to the following description taken in connection with the accompanying drawings.

Figure 1:
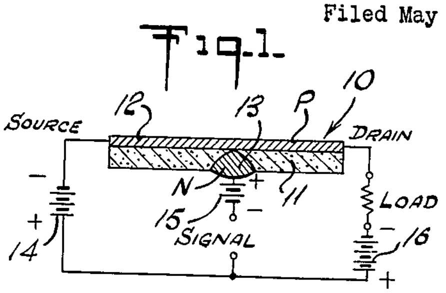
Fig. 1 is a cross sectional view of one form of the field effect transistor with a wiring diagram of connections to show how the device can be used as an amplifier.

Referring now to Fig. 1, the field effect transistor 10 includes a block 11 of insulating material which is a semiconductor alloyed or diffused with another element which lowers its conductivity to such a small value that it may be considered an insulator. An example of such a substance is silicon diffused with gold. The block 11 acts only as a supporting element once the transistor is complete.

In order to form the thin conducting layer 12, the block 11 is subjected to a diffusing process which diffuses an impurity into the material to make either an N-type or P-type conductivity layer. The thickness of this layer may be of the order of a thousandth of an inch, the drawings being exaggerated for the sake of clarity.

A small pellet of impurity metal is next placed on the other side of block 11 and heated until the pellet melts and alloys with the block. The metal should be of the type which produces a conductivity opposite to the conductivity type of the upper layer 12. After alloying, the combination may be kept at an elevated temperature until enough impurity has diffused into the block to make conductive contact with the upper layer. This conductive portion 13 is used as a "gate" or "grid" when connected in an operating circuit since it serves to control the flow of current from one end of the layer 12 to the other.

In Fig. 1, the upper layer 12 is designated as a P-type material while the gate is marked N. Biasing batteries 14, 15, and 16 are connected with their polarities as indicated to agree with these types of conductivity. If the conductivity types are interchanged, all battery polarities must be changed.

Figure 2:
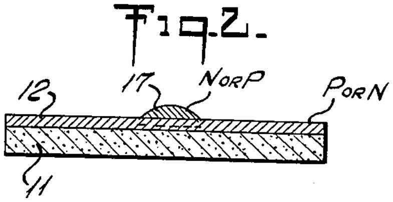
Fig. 2 is a cross sectional view similar to Fig. 1 but showing an alternate arrangement.

The transistor shown in Fig. 2 is made in a manner similar to the one shown in Fig. 1, except that the gate electrode 17 is diffused onto the upper surface of the block 11. The electrical connections are the same as those described above.

Figure 3:
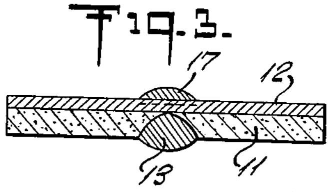
Fig. 3 is a cross sectional view of a field effect transistor combining the features shown in Figs. 1 and 2.

The transistor shown in Fig. 3 is a combination of those shown in Figs. 1 and 2, and includes two gate electrodes 13 and 17. Operating electrical connections can be made in the same manner as shown in Fig. 1 with the two electrodes 13 and 17 connected together.

Figure 4:
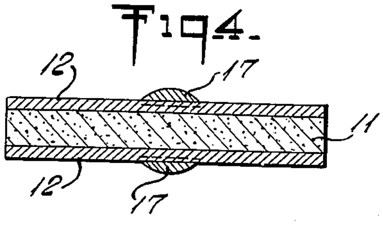
Fig. 4 is a cross sectional view similar to Fig. 2 but showing two transistors, one on each side of a single insulator block.

The transistor shown in Fig. 4 is the same as the transistor shown in Fig. 2 except that both sides of the insulator block 11 have been treated to form conductive layers. The operation is the same as described above. Double transistor combinations such as these are useful in push-pull circuits and other amplifier combinations requiring two similar transistor units.

Figure 5:
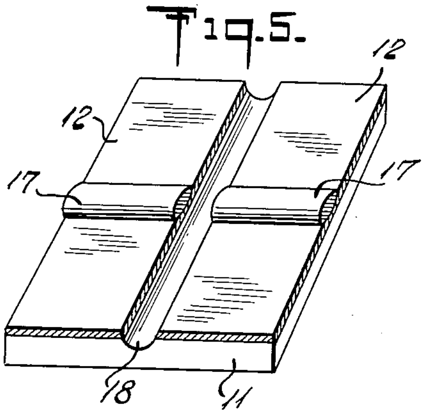
Fig. 5 is an isometric view of a single insulator block containing two field effect transistors on one of its faces, separated by a channel.

The transistor shown in Fig. 5 is a double unit with both units disposed on the same side of the insulator block 11. This design permits greater heat dissipation than the form shown in Fig. 4 and the insulator block 11 may be secured to a metallic heat sink for additional heat conduction. A central dividing area 18 may be formed by a mask during the diffusion process or it may be removed by a cutting tool after the final diffusion operation. It should be pointed out that the removal of semiconductor material in such an operation is not subject to the precise control which is necessary when cutting off or abrading parts of semiconductor electrodes which are later to be processed. In the present case the depth and width of the dividing area or slot 18 does not influence the operating characteristics of the transistors.

Figure 6:
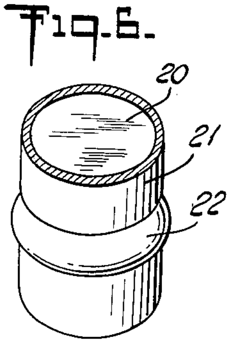
Fig. 6 is an isometric view of a rod of insulator material surrounded by a conducting film and an added gate annulus.
Figure 7:
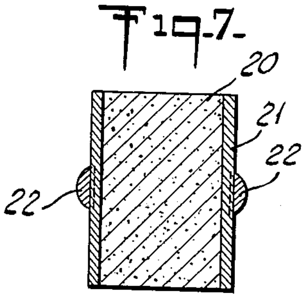
Fig. 7 is a longitudinal sectional view of the transistor shown in Fig. 6.

Field effect devices as described above may be formed on cylinders as shown in Figs. 6 to 9. In Figs. 6 and 7 a solid rod 20 of insulating material is treated as described above and a thin layer of P or N-type semiconductive material 21 is formed on the surface. Then the opposite type material 22 is formed around the cylinder, as shown, to form the gate. The transistor shown in Figs. 6 and 7 is similar to the flat form shown in Fig. 2.

Figure 8:
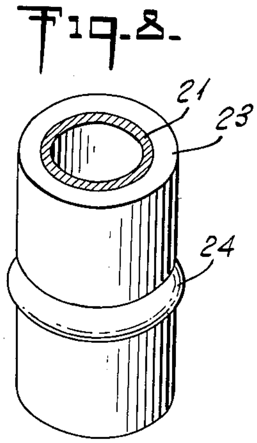
Fig. 8 is an isometrical view of a tube of insulating material with added circular conductive components similar to the device shown in Fig. 1.
Figure 9:
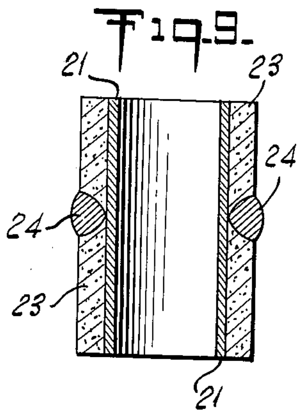
Fig. 9 is a longitudinal sectional view of the transistor shown in Fig. 8.

Figs. 8 and 9 show an alternate arrangement similar to the transistor shown in Fig. 1 where a hollow insulating cylinder 23 is used as the supporting base. The semiconductive layer 21 is diffused on the inside surface of the cylinder and a ring of the opposite conductivity type is alloyed and diffused on the outside surface.

All the transistors shown are supported by an insulating base material which can be made of several alloys such as silicon-gold. The strong base adds nothing to the electrical operation but does contribute to the ease in forming the transistors and adds considerably to its mechanical strength and heat distributing qualities.

The foregoing disclosure and drawings are merely illustrative of the principles of this invention and are not to be interpreted in a limiting sense. The only limitations are to be determined from the scope of the appended claims.

What is claimed is:

1. A field effect transistor comprising, a quantity of semiconductor material diffused with an element to produce a supporting block having a substantially zero conductance, a semiconductor layer formed on the surface of said block by the diffusion of impurities into said block for the transmission of current between two terminal areas of said layer, and a semiconductor electrode having a conductivity type opposite to that of the layer conductivity type positioned between said terminal areas for the application of a controlling voltage.

2. A field effect transistor as set forth in claim 1 wherein said semiconductor electrode is positioned on the interior surface of said layer and is formed by diffusion of an impurity into said supporting block.

3. A field effect transistor as set forth in claim 1 wherein said semiconductor electrode is positioned on both sides of said layer.

4. A field effect transistor comprising, a quantity of semiconductor material diffused with a substance which produces a supporting block having a substantially zero conductance, a semiconductor formed on one of the surfaces of said block by the diffusion of impurities into the block for the transmission of current between two terminal areas of said layer, and a semiconductor electrode having a conductivity type different to that of the layer conductivity type positioned beween said terminal areas for the application of a controlling voltage, said semiconductor electrode positioned on the exterior surface of said layer.

5. A field effect transistor comprising, a quantity of semiconductor material alloyed by impurities to produce a supporting block having at least two plane surfaces and a substantially zero conductance, a semiconductor layer formed on said two plane surfaces for the transmission of current between two terminal areas on each of said layers, and a semiconductor strip electrode on each of said layers respectively, positioned between said two layer terminals, said semiconductor strips having a conductivity type which differs from the conductivity type of the layer material.

6. A field effect transistor comprising, a quantity of semiconductor material diffused by impurities to produce a supporting cylinder having substantially zero conductance, a semiconductor layer formed on the outside surface of said cylinder for the transmission of current between two end terminal areas, and a semiconductor strip electrode surrounding said layer positioned between two terminal areas, said strip electrode serving for the application of a controlling voltage and made of a material having a conductivity type differing from that of the layer material.

7. A field effect transistor comprising, a quantity of semiconductor material diffused by impurities to produce a supporting cylinder having substantially zero conductance, a semiconductor layer formed on the inside surface of the hollow cylinder for transmission of current between two end terminal areas, and a semiconductor strip electrode surrounding the outside surface of said cylinder and penetrating the cylinder material to make contact with said layer, said strip electrode serving for the application of a controlling voltage and made of a material having a conductivity type differing from that of the layer material.

8. A field effect transistor comprising, a quantity of silicon treated with gold to make it substantially nonconductive, a semiconductor layer on the surface of said silicon diffused with an impurity to make it conductive for the passage of electric current between two spaced-apart terminal areas, and a semiconductor strip electrode positioned between said areas, said strip electrode made of material having a conductivity type different from the conductivity type of said layer.

References Cited in the file of this patent

UNITED STATES PATENTS

| | | |
|---|---|---|
| 2,681,993 | Shockley | June 22, 1954 |
| 2,697,052 | Dacey et al. | Dec. 14, 1954 |
| 2,754,431 | Johnson | July 10, 1956 |